METHOD OF FORMING AN ULTRAFINE APERTURE MASK

Filed April 8, 1971

INVENTOR
Harold S. Gurev
BY
Mueller & Aichele
ATTY'S 3,728,231

METHOD OF FORMING AN ULTRAFINE APERTURE MASK

Harold Samuel Gurev, Paradise Valley, Ariz., assignor to Motorola, Inc., Franklin Park, Ill.

Filed Apr. 8, 1971, Ser. No. 132,495
Int. Cl. C23b *5/48*
U.S. Cl. 204—15 13 Claims

ABSTRACT OF THE DISCLOSURE

There is disclosed an ultrafine aperture metal mask and a method for forming the mask involving an electroplating step. Apertures are first formed by conventional techniques through a metal layer which is deposited on a glass, resin, ceramic or semiconductor type substrate. Thereafter, the patterned metal film is immersed in an electroplating bath which electroplates a metal which adheres to the metal film so as to close down the already formed apertures in the metal film. The substrate is nonconductive such that the metal from the electroplating bath does not deposit on the substrate. In this manner pinholes on the order of 0.1 to 0.2 micron can be formed from apertures having mean diameters of between 1 and 25 microns initially. The ultrafine aperture metal mask thus formed may be used in itself as a gas filter, as a diffusion mask and as a radiation mask for X-ray, gamma-ray or light. As a light mask it is most generally used for making other pinholed structures by photolithographic process. In addition the metal mask may be used directly for making other pinhole structures by etching through the mask with etchants which do not attack the mask itself. In one embodiment the metal mask is used either directly or indirectly to pattern a glassy substrate so that the glassy substrate then forms a diffusion barrier, a metallization mask, a filter or a screen.

BACKGROUND

This invention relates to pinholed structures and more particularly to a method of forming sub-micron apertures in a metal sheet or film.

The present state of the art permits the formation of 1 to 2 micron diameter holes or apertures in a planar sheet or layer by conventional optical techniques. These micron range apertures, while being sufficient for most applications, are not sufficient for the production of pinhole structures in the sub-micron range. The requirement of providing pinhole structures in the sub-micron range has recently arisen in the area of the formation of vertical resistors. In this area the resistance value of the vertical resistor is controlled by the size and distribution of pinholes in a dielectric over which is deposited a metallized film or layer with the metallized film extending down into the pinholes to contact the resistive film of the vertical resistor. Control of the resistivity of the resistor is dependent upon control of the size and distribution of the pinholes. In order to obtain high value resistors with many contact points the pinholes must be in the sub-micron range. In addition, gas filters, chemi-selective membranes and diffraction gratings require structures with apertures in the sub-micron range depending on the gas particle size or the wavelength of radiation involved. As such a pinholed metal film can operate to perform these functions.

If it is undesirable to utilize the metal film itself as a barrier with sub-micron apertures, it is possible to pattern suitable underlying substrates or layers with apertures corresponding to the apertures in the overlying metal film. Indeed it may be less costly to provide a metal film with the sub-micron apertures and then utilize this metal film as a photo or etch mask to form the required pinholes in another material.

It will be appreciated that the technique to be described herein produces apertures of the same size range as those that can now be formed with electron beam techniques in which a photoresist material is exposed to the electron beam. One of the reasons that the subject technique is better than the electron beam exposure technique is that it is less expensive and is less time consuming.

In cases where accurate spacing of sub-micron apertures is important spacing can be provided initially by conventional optical techniques in which the larger apertures are initially formed. These apertures are then closed down by the subject technique in a substantially symmetrical fashion such that the inter-aperture spacing is maintained while the aperture size itself is reduced by a factor of 10. Additionally, the subject technique is an improvement over the electron beam exposure method in that the aperture size can be more readily varied and controlled.

The subject technique involves the closing down or restricting of apertures already formed in a metal film, layer or sheet by immersing the metal film in an electroplating bath for a time sufficient to deposit the required amount of material on the interior walls of the already formed apertures. The metal film to be patterned is initially placed on a non-conductive substrate. Thus, the electrodeposited metal adheres only to the inside walls of the preformed apertures and not to the substrate. In one method, the preformed apertures are formed in the metal layer by conventional photolithographic and etching techniques to be 1 to 2 microns in diameter with an inter-aperture spacing of 25 microns. The structures on which the metal layer is first deposited can be glass, ceramic, resin or other non-conductors. Additionally, the metal can be deposited on semiconductor material depending on the application to which the pinholed structure is to be put. If the substrate is a gas permeable material, the pinholed metallized structure can be utilized as a chemi-selective filter such that those gas molecules or atoms which penetrate the metal layer at the apertures are passed without substantial attenuation through the material.

If the substrate is of a semiconductor material then the metal mask may be utilized to provide very small doped areas in the substrate by diffusing through the pinhole apertures in the mask. The doping position and area can be controlled by the diameter of the apertures in the metal mask.

If the metal mask is formed on a transparent substrate the pinholed structure can be utilized as a radiation mask for any type of radiation including X-ray and gamma ray. The radiation mask thus formed can also be utilized as a photoresist mask for the patterning of other structures.

If the metal layer deposited on a substrate is a noble metal then the patterned metal layer can be utilized to provide pinhole apertures in the substrate therebeneath by utilizing etching solutions which do not attack the noble metal layer. Thus, a pinholed structure can be formed either by directly etching the aforementioned substrate utilizing a noble metal etch mask or the substrate can be provided with the required sub-micron pinholes by first utilizing the metal pinholed mask as a photoresist mask for a photoresist layer which lies on top of the substrate. After the photoresist has been exposed by light coming through the pinholed metal layer it is then developed. The photoresist thus acquires sub-micron pinholes. The substrate therebeneath is then etched by an etchant which does not attack the photoresist but attacks the material therebeneath. The removal of the metal etch mask or the patterned photoresist after etching leaves a patterned structure which may be utilized for diffusion, as a filter or screen, or as a metallization mask for the aforementioned vertical resistor.

SUMMARY OF THE INVENTION

It is therefore an object of this invention to provide a method for forming sub-micron apertures in a metallic layer, sheet or film.

It is a further object of this invention to provide a method for forming sub-micron apertures in a metal structure which is initially provided with larger apertures by providing an electroplating step in which the already provided apertures are restricted by the formation of metal deposits on the interior walls of the apertures from the electroplating bath.

It is a still further object of this invention to provide a method for providing sub-micron apertures in a substrate material over which is deposited a metal layer which is provided with sub-micron apertures by the restricting of larger apertures preformed in the metallized layer.

It is yet another object of this invention to provide an improved gas filter in which the chemi-selective nature of the filter is provided by sub-micron apertures in the metal layer.

It is yet another object of this invention to provide an improved diffusion mask with sub-micron apertures formed in a metallized layer either used by itself as the mask or used to form a pinholed mask of a non-metallic material.

It is yet a still further object of this invention to provide a radiation mask having sub-micron apertures therethrough which mask may be utilized as a photoresist mask, a diffraction grating and as a mask for all kinds of radiations.

It is a still further object of this invention to provide a pinholed metal member for shaping magnetic fields.

It is a further object to provide a mask for altering the spacial distribution of electrons and other charged particles.

It is a still further object of this invention to provide an improved etch mask made of metal for use in the patterning of selected substrates therebeneath.

It is yet a further object of this invention to provide an improved filter or screen having sub-micron apertures therethrough.

Other objects and features of this invention will become more fully apparent upon reading the following description in connection with the accompanying drawings.

BRIEF DESCRIPTION OF THE INVENTION

There is disclosed an ultrafine aperture metal mask and a method for forming the mask involving an electroplating step. Apertures are first formed by conventional techniques through a metal layer which is deposited on a glass, resin, ceramic or semiconductor type substrate. Thereafter, the patterned metal film is immersed in an electroplating bath which electroplates a metal which adheres to the metal film so as to close down the already formed apertures in the metal film. The substrate is non-conductive such that the metal from the electroplating bath does not deposit on the substrate. In this manner pinholes on the order of 0.1 to 0.2 micron can be formed from apertures having mean diameters of between 1 and 25 microns initially. The ultrafine aperture metal mask thus formed may be used in itself as a gas filter, as a diffusion mask and as a radiation mask for X-ray, gamma-ray or light. As a light mask it is most generally used for making other pinholed structures by photolithographic process. In addition the metal mask may be used directly for making other pinhole structures by etching through the mask with etchants which do not attack the mask itself. In one embodiment the metal mask is used either directly or indirectly to pattern a glassy substrate so that the glassy substrate then forms a diffusion barrier, a metallization mask, a filter or a screen.

DETAILED DESCRIPTION OF THE INVENTION

As mentioned hereinbefore, there has been considerable problem in the formation of structures having sub-micron apertures or holes therethrough. One of the standard ways of producing the sub-micron apertured structures involves the utilization of an electron beam. Utilization of an electron beam to produce pinholed structures in any quantity is prohibitively expensive due to the initial expense of the apparatus for forming and controlling the electron beam.

Moreover, electron beam processes for producing a substantial number of pinholes is extremely time consuming due to the number of positions at which precise apertures must be formed. Both the position and the aperture size of the numerous holes in a metallized layer can be made and controlled in the subject invention by first photolithographically forming apertures in a photoresist over a metal layer and then by etching through the photoresist to the underlying metal layer so as to provide relatively large but accurately spaced apertures in the layer. Thereafter the apertures are restricted by electroplating.

Figure 1:
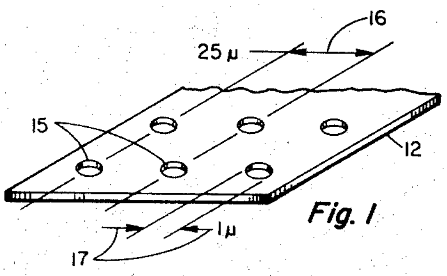
FIG. 1 is a diagram showing a metallized layer having preformed apertures in the micron range formed therein.

The formation of these relatively large apertures in the metal layer is shown in FIG. 1. In this figure, the metal layer is shown by the reference character 12 to have apertures 15 formed therein with an inter-aperture spacing of approximately 25 microns as shown by the arrow 16. The aperture size which refers to the diameter of the apertures is shown by the arrows 17 to be on the order of 1 micron. It will be appreciated that the 1 micron aperture size represents the current lower limit which can be achieved by photolithographic techniques.

Figure 2:
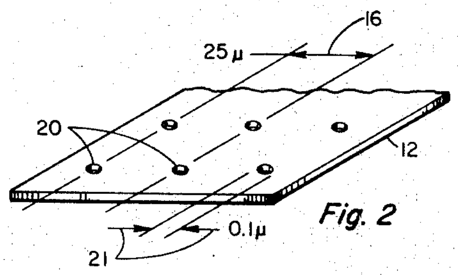
FIG. 2 is a diagram of the structure shown in FIG. 1 after it has been immersed in an electroplating bath so as to narrow the preformed apertures.

The structure shown in FIG. 2, is the structure shown in FIG. 1 after it has been immersed in an electroplating bath so as to restrict the apertures. As can be seen, the metal layer 12 is now provided with sub-micron apertures 20 with inter-aperture spacings of 25 microns as shown by the arrow 16 in FIG. 2. The apertures 15 of FIG. 1 have been restricted by this process by approximately an order of magnitude so that the aperture size now shown by arrows 21 is on the order of 0.1 micron.

It will be appreciated that the metallized layer 12 is a metal or alloy which adheres to the substrate on which it is deposited. The metal in the electroplating bath is chosen so that it readily adheres to the metal layer 12 without adhering to the substrate material. The metal in an electroplating bath will not plate on the substrate material because the substrate is non-conductive.

Figures 3A, 3B, 3C, 4A, 4B, 4C, 5A, 5B, 5C, 6A, 6B, 6C:
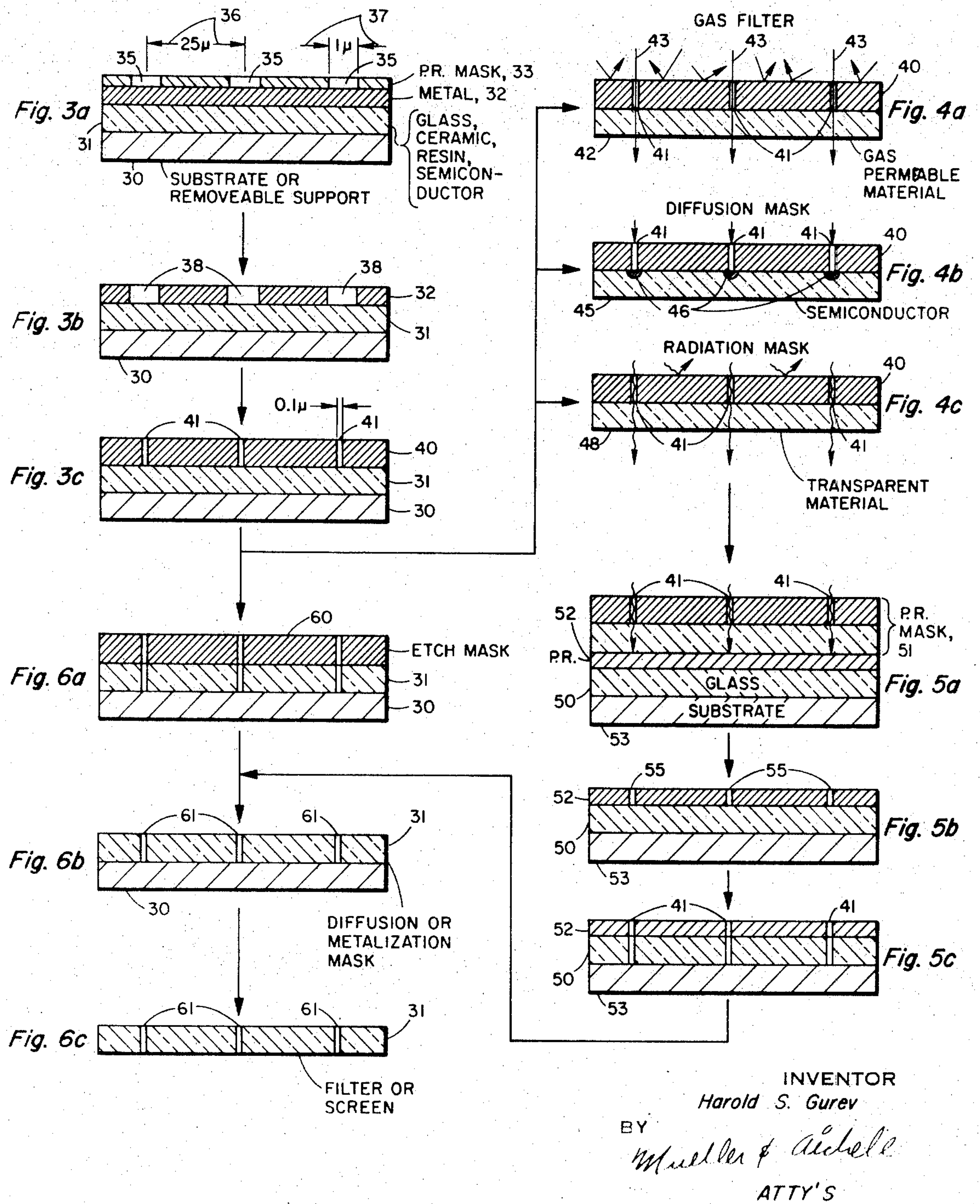
FIGS. 3*a*–3*c* illustrate the subject method of obtaining a sub-micron pinholed metallized layer on top of a substrate.
FIGS. 4*a*–4*c* illustrate various uses of the pinholed metallized layer shown in FIG. 3*c*. The uses include a gas filter when a permeable substrate is utilized, a diffusion mask when a semiconductor substrate is utilized, and a radiation mask when a transparent substrate is utilized.
FIGS. 5*a*–5*c* illustrate the utilization of the radiation mask shown in FIG. 4*c* to pattern a photoresist layer, which is subsequently used to provide corresponding pinholes in the material on which the photoresist layer is deposited.
FIGS. 6*a*–6*c* illustrate the use of the pinholed metallization layer shown in FIG. 3 as an etch mask for the direct formation of sub-micron pinholes in the material underlying the pinholed metal etch mask.

The method of providing both the larger apertures initially in the metallized layer and then the smaller apertures occurring after the aforementioned electroplating process is shown in FIGS. 3*a*–3*c*. In FIG. 3*a*, a substrate or removable support 30 is provided with a non-conductive layer 31 of glass, ceramic, resin or other non-conductive material. Additionally layer 31 may be a semiconductor layer. Over layer 31 is deposited a metallic layer 32. On the metallic layer 32 is provided a photoresist mask 33 which has been previously patterned by conventional photolithographic techniques so as to have apertures 35 therethrough with a predetermined center to center spacing as shown by the arrows 36. The diameter of these apertures is in the micron range as shown by the arrows 37. In one embodiment the substrate or removable support 30 is a resin which can be developed and removed from the bottom side of the structure. The layer 31 is in one instance silicon dioxide which is applied over the substrate 30. The metal layer 32 is in one instance composed of molybdenum and gold which adheres to the silicon dioxide layer 31. This metal is in thin film form having a thickness of 1,000 angstroms to 10,000 angstroms. It will be appreciated that the thickness of the metal layer 32 is not critical and can be made to any required thickness depending on the etchant utilized to form the apertures therethrough. The photoresist 33 can be any one of several commercially available photoresists and in general is an organic resin in which poly-cross-linking occurs in the illuminated areas. The photoresist layer 33 is shown patterned with apertures 35 and as such provides an etch mask for the etchant utilized to etch the metal layer 32. As shown in FIG. 3*b*, the metal layer 32 is etched in the areas directly under the apertures 35 so as to provide apertures 38 corresponding in size and position to the apertures 35 of FIG. 3*a*. The entire structure shown in FIG. 3*b* is then immersed in an electroplating bath so as to form the layer 40 shown in FIG. 3*c*. As can be seen from FIG. 3*c*, the apertures 38 of FIG. 3*b* have been significantly narrowed as shown by the apertures 41. In one example, the apertures were narrowed to a 0.1 micron diameter by the electroplating step. It will be seen that the thickness of the metal layer 32 is increased by an amount proportional to the decrease in aperture size of the apertures 38.

In one embodiment, the electroplating bath necessary to provide for the narrowed apertures is as follows:

Table I

Gold plating—from potassium-gold cyanide solution with:

Au—4–12 grams/liter in water
Potassium citrate—90 grams/liter
pH—3–6 (controlled by the addition of citric acid)
Current density—up to 10 amps/square foot
Anodes—carbon or platinized titanium
Plating rate—50–60 microinches per hour
Bath temperature—120–150° F. (50–66° C.)

In practice, the structure shown in FIG. 3*b* is sensitized. The word "sensitized" in this context refers to reducing the surface of the molybdenum-gold layer so as to remove oxides from the surface of the layer 32. After sensitization, a conditioner is applied to the surface of the layer to make it cathodic. The one embodiment, the conditioner is a cyanide solution which results in a hydrogen washing action when current is applied. As such the step is referred to as a hydrogen wash step and is conventional in the electroplating art. Thereafter, the prepared substrate is immersed in the above plating bath so as to provide a gold strike. After the provision of the gold strike the structure with the gold strike is removed and placed in a second plating bath which is formed as shown in Table II.

Table II

Au—4 to 12 grams/liter in water
Potassium cyanide—30 grams/liter
Potassium carbonate—30 grams/liter
Potassium phosphate—30 grams/liter
Temperature—120 to 100° F.
pH—8 to 10
Current density—5 amps/square foot
Anodes—carbon or platinized titanium It will be appreciated that the example just given is of a specific variety. It will be understood that any metal layer 32 may be utilized and that any compatible metal may be utilized in the plating bath. The plating parameters shown in Tables I and II are conventional and are taken from the "Metal Finishing Guidebook Directory," Metals & Plastics Publications, Inc., Westwood, N.J., 1969. The specific conditions for the electroplating are that the metal in the electroplating bath adhere to the metal layer 32 without adhering to the substrate 31.

Although the aperture size can be related to the plating conditions, it has been found that accurate determination of the aperture size can better be performed by utilizing a scanning electron microscope. To establish process controls, the plating operation is broken up into a series of identical plating steps and the article examined at the end of each one of these steps by the scanning electron microscope so as to be able to determine when the appropriate hole size has been reached. Thereafter, aperture size can be determined by reference to the plating parameters used to establish the controls.

This completes the fabrication of the pinholed metal film or layer 40 on the substrate 31. Thereafter, the removal support 30 may be developed or washed off so as to leave the structure shown in FIGS. 4*a*–4*c*.

As such the pinholed metal layer 40 on substrate 31 can serve by itself as a gas filter as shown in FIG. 4*a*, as a diffusion mask as shown in FIG. 4*b*, or as a radiation mask as shown in FIG. 4*c*, depending on the substrate material utilized for the layer 31 in FIGS. 3*a*–3*c*.

Referring to FIG. 4*a*, the substrate is a porous or gas permeable material. This material is sufficiently permeable to permit the diffusion therethrough of any gas which passes through the pinholed metallized layer 40. The passage of gas or entrained solids is shown by the arrows 43. Other gas molecules or particulate matter either too large to enter the apertures 41 or impinging upon the surface of layer 40 are shown reflected off in the various directions.

FIG. 4*b* shows the utilization of the pinholed metal layer 40 in conjunction with semiconductor material 45. In this embodiment, a suitable dopant is diffused into the semiconductor material 45 through the apertures 41 so as to produce extremely small doped regions 46 in the semiconductor material 45. In this manner, very small doped regions can be formed in a semiconductor substrate. As shown in FIG. 4*c*, the pinholed metal layer 40 can be utilized as a radiation mask for all types of radiation including X-ray, gamma ray and light in the visible portion of the electromagnetic spectrum. In this case the light passes through the apertures 41 and through the transparent substrate which in this case is a glass layer shown at 48. By the appropriate positioning and size of the apertures 41 the metal layer 40 can serve as a diffraction grating, as an optical filter, or as a photoresist mask for light in the visible region of the spectrum depending on the index of refraction of the glass 48, aperture spacing and the aperture size of the apertures 41.

As mentioned hereinbefore, the pinholed metal layer can be utilized in and of itself or can be utilized in the formation of sub-micron apertures in other materials. One method showing this latter use for the pinholed metal layer is shown in FIGS. 5*a*–5*c*. In these figures, a glass layer 50 is provided with the aforementioned apertures 41 by use of a photoresist and etching process. A photoresist mask 51 consisting of the metal layer 40 and the glass layer 48 shown in FIG. 4*c* is positioned adjacent a photoresist layer 52 which is in turn positioned over the glass layer 50 mounted on a substrate 53. As shown in FIG. 5b, after the photoresist has been exposed by light coming through the apertures 41 in the photoresist mask 51 and after the photoresist has been developed, the photoresist acquires a pinholed structure shown by apertures 55 similar in size and location to apertures 41 in the photoresist mask 51. An etchant is then used which does not attack the photoresist layer 52 so as to etch the glass layer 50 completely therethrough. This structure is shown in FIG. 5*c* such that the apertures 41 shown in this figure correspond exactly to the apertures 41 in the photoresist mask 51. The substrate 53 in this case can also be a removable resin or can be a semiconductor material into which a dopant is to be diffused or can be an already fabricated semiconductor article to which must be applied a metallization layer through the apertures 41 in FIG. 5*c*. In order to apply the metallization layer, the photoresist layer 52 is removed and the metallization applied thereover so as to extend down into the apertures 41.

As shown in FIG. 6*a*, the pinholed metallization layer 40 may be utilized as an etch mask. In this case, a metal, usually a noble metal which will not be attacked by a selected etchant for the substrate 31, is utilized. In FIGS. 6*a*–6*b*, it will be apparent that the metal layer 40 can directly provide sub-micron apertures in the substrate material. As shown in FIG. 6*a*, the etch mask 60 is positioned over the substrate 31 which is in turn positioned over a removable support 30 corresponding to the structures shown in FIGS. 3*a*–3*c*. The structure shown in FIG. 3*c* is then subjected to an etchant such that the substrate 31 is etched completely therethrough down to the removable support 30. Alternately, the structure or layer 30 can be made of a semiconductor material. As shown in FIG. 6*b*, the metal etch mask 60 is removed leaving thereby the layer 31 with pinholes or sub-micron apertures 61 therein. It will be appreciated that this same structure can be obtained from the structure shown in FIG. 5*c* by merely removing the photoresist 52. As mentioned in connection with FIG. 5*c* the structure shown in FIG. 6*b* can be utilized as a diffusion mask or as a metallization mask if the layer 30 is made of a semiconductor material which has been appropriately prepared.

If the layer 30 is of a resistive material such as Nichrome and if the structure shown in FIG. 6*b* is provided with a metallization layer (not shown) extending down through the apertures 61 then a variety of contacts will have been made to the surface of the layer 30. If the resistive layer 30 is then provided with a backing contact on its bottom surface, the structure then becomes a vertical resistor whose resistance value can be varied by the areal density of the apertures 61.

As shown in FIG. 6*c*, if the layer 30 is a removable support layer, being made of a resin which can be easily washed or developed off, the resulting structure is a glass filter or screen having the appropriate apertures 61 therein. Thus, the metal etch mask or the metal photoresist mask aids in producing a pinholed structure of a different material. These materials can be glasses, ceramics, resins or the like. It will be appreciated that if the layer 31 is to be used alone as a filter or a screen, its thickness must be made commensurate with a self-supporting mechanical structure.

What is claimed it:

1. A method for forming submicron apertures in a metal layer comprising the steps of:

depositing a layer of metal on a substrate which is of a type to which said metal adheres, forming apertures in said metal layer at predetermined locations, said apertures having a diameter in the micron range, electroplating onto said layer a quantity of a metal which does not plate on said substrate and which adheres to the side walls of said apertures, said quantity being sufficient to restrict said apertures to diameters in the sub-micron range, the diameter of said restricted apertures being a function of the length of time said layer is immersed in the electroplating bath, the constituents of said bath and the current densities employed, whereby sub-micron apertures are formed through said metal layer.

2. The method as recited in claim 1 wherein said apertures are initially formed by a photolithographic process.

3. The method as recited in claim 1 wherein said substrate is transparent to radiation, whereby the structure formed by said method is used as a radiation mask, a diffraction grating and as a selective optical filter.

4. The method as recited in claim 1 wherein said substrate is a gas permeable material, whereby the structure thus formed is used as a filter whose properties depend on the size of said restricted apertures.

5. The method as recited in claim 1 wherein said substrate is a semiconductive material, whereby the metal structure formed thereby acts as a diffusion mask for dopants diffused into said semiconductive substrate.

6. The method as recited in claim 1 wherein said metal layer is impervious to etchants used to etch said substrate, the metal structure thus formed acting as an etch mask for said substrate, whereby whenever said substrate is etched by applying an etchant over said metal layer, a structure is formed having sub-micron apertures therethrough corresponding in size and location to the sub-micron restricted apertures in said metal layer.

7. A method for forming sub-micron apertures in a flat structure comprising the steps of:

depositing a layer of metal on a substrate which is transparent to radiation which is of a type to which said metal adheres, but on which metal from an electroplating bath does not plate, forming apertures in said metal layer at predetermined locations, said apertures having a diameter in the micron range, electroplating onto said metal layer a quantity of a metal which adheres to the side walls of said apertures, said quantity being sufficient to restrict said apertures to diameters in the sub-micron range, the diameter of said restricted apertures being a function of the length of time said layer is immersed in the electroplating bath, the constituents of said bath and the current densities employed, whereby the structure thus formed constitutes a photoresist mask, providing said flat structure with a photosensitive layer on a surface thereof, interposing said mask between said photosensitive layer and a radiation source, irradiating said photosensitive layer with radiation to which it is sensitive, said radiation passing only through said restricted apertures and impinging on said photosensitive layer, developing said photosensitive layer such that apertures corresponding in size and location to said restricted apertures are formed in said photosensitive layer, etching said flat structure with an etchant that does not attack said photosensitive layer such that said flat structure is provided with apertures corresponding in size and location to the restricted apertures in said photoresist mask, whereby sub-micron apertures are formed in said flat structure.

8. The method as recited in claim 7 and further including the step of removing said photosensitive layer after said sub-micron apertures are formed in said flat structure, whereby said flat structure functions itself as a filter, a diffusion mask, as a radiation mask, and as a metallization mask.

9. The method as recited in claim 7 wherein said layer of metal is an alloy of molybdenum and gold and wherein the metal in said plating bath is gold.

10. The method as recited in claim 7 wherein the size of said restricted apertures is measured by a scanning electron microscope so as to determine when a sufficient quantity of the metal in said plating bath has been electroplated.

11. The method as recited in claim 7 wherein said photosensitive layer is a layer of positive photoresist.

12. The method as recited in claim 7 wherein said flat structure is a layer of glassy material.

13. The method as recited in claim 12 wherein said glassy material is silicon dioxide.

References Cited

UNITED STATES PATENTS

| | | | |
|---|---|---|---|
| 3,340,607 | 9/1967 | Shutt | 204—15 |
| 2,848,359 | 8/1958 | Talmey | 204—15 |

JOHN H. MACK, Primary Examiner

R. L. ANDREWS, Assistant Examiner

U.S. Cl. X.R.

204—38 B